United States Patent
Durante et al.

(10) Patent No.: US 6,370,651 B1
(45) Date of Patent: Apr. 9, 2002

(54) SYNCHRONIZING USER COMMANDS TO A MICROCONTROLLER IN A MEMORY DEVICE

(75) Inventors: Richard J. Durante, Citrus Heights; Rodney R. Rozman; Mickey L. Fandrich, both of Placerville, all of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 08/688,235

(22) Filed: Jul. 29, 1996

Related U.S. Application Data

(63) Continuation of application No. 08/141,872, filed on Oct. 22, 1993, now abandoned.

(51) Int. Cl.[7] .................................................. G06F 1/32
(52) U.S. Cl. ........................................ 713/322; 713/601
(58) Field of Search .................. 395/430; 713/300–340, 713/400–601

(56) References Cited

U.S. PATENT DOCUMENTS

| | | | | |
|---|---|---|---|---|
| 3,626,210 A | * | 12/1971 | Spence | 327/172 |
| 5,167,024 A | * | 11/1992 | Smith et al. | 713/322 |
| 5,222,046 A | * | 6/1993 | Kreifels et al. | 365/185.22 |
| 5,265,059 A | | 11/1993 | Wells et al. | 365/204 |
| 5,333,300 A | * | 7/1994 | Fandrich | 395/430 |
| 5,345,424 A | * | 9/1994 | Landgraf | 365/227 |
| 5,353,256 A | * | 10/1994 | Fandrich et al. | 365/185.11 |
| 5,355,503 A | * | 10/1994 | Soffel et al. | 713/322 |
| 5,369,754 A | * | 11/1994 | Fandrich et al. | 711/103 |
| 5,448,712 A | * | 9/1995 | Kynett et al. | 395/430 |
| 5,463,757 A | * | 10/1995 | Fandrich et al. | 395/430 |
| 5,509,134 A | * | 4/1996 | Fandrich et al. | 395/430 |
| 5,513,333 A | * | 4/1996 | Kynett et al. | 395/430 |
| 5,603,036 A | * | 2/1997 | Wells et al. | 713/322 |
| 5,696,977 A | * | 12/1997 | Wells et al. | 713/322 |

OTHER PUBLICATIONS

Seki et al. "AN 80–nS 1–Mb flash memory with on chip erase/erase–verify controller" IEEE Journal of Solid State Circuits vol. 25 p. 1147–52, Oct. 1990.*

* cited by examiner

*Primary Examiner*—St. John Courtenay, III
(74) *Attorney, Agent, or Firm*—Blakely, Sokoloff, Taylor & Zafman LLP

(57) ABSTRACT

A method and apparatus for synchronizing a micro controller in a flash memory device. An interface circuit receives a user command over a host bus. A synchronizer circuit enables an oscillator circuit if the user command specifies an operation on a flash cell array. The oscillator circuit generates a clock signal for synchronizing the micro controller. After completion of the program or erase operation, the synchronizer circuit disables the oscillator circuit if a subsequent user command that specifies another program or erase operation for the micro controller is not pending.

29 Claims, 7 Drawing Sheets

SYNCHRONIZING USER COMMANDS TO A MICROCONTROLLER IN A MEMORY DEVICE

This application is a continuation of Ser. No. 08/141,872 filed Oct. 22, 1993 now abandoned.

BACKGROUND OF THE INVENTION

1. Field of the Invention

The present invention pertains to the field of integrated circuit memory devices. More particularly, this invention relates to synchronizing user commands for an array controller in a memory device.

2. Art Background

A flash memory device implements a flash cell array for non-volatile random access data storage for a computer system. A typical prior flash memory device implements a write control circuit for performing program and erase options on areas of the flash cell array. Such a write control circuit typically programs flash cells by applying a predetermined sequence of program level voltages to the flash cells.

Typically, a user provides an input/output driver program that issues user commands to the flash memory device. The user commands commonly include commands for programming and erasing portions of the flash cell array. The write control circuit usually receives and verifies the user commands and performs the functions specified to program or erase an area of the flash cell array.

A flash memory device may implement a specialized micro controller for performing program and erase algorithms on the flash cell array. Such a specialized micro controller is typically driven by an oscillator circuit. The oscillator circuit generates the necessary clock signals to synchronize the operation of the micro controller.

In such systems, the oscillator circuit can be disabled after the micro controller executes a user command and shuts down. The disabled oscillator circuit halts the micro controller and reduces power consumption of the flash memory device. The oscillator circuit is then re-enabled when a subsequent user command is received. The micro controller restarts and performs the program or erase operation specified by the subsequent user command.

The user commands transferred to the flash memory device are usually not synchronized to the micro controller. The user commands are usually transferred to the flash memory device over a host bus, and are typically synchronized by a write enable signal on a control portion of the host bus. The timing of the write enable signal usually has no relation to the timing generated by the oscillator circuit.

As a consequence, a race condition can exist when the flash memory device receives the subsequent user command during a shut down sequence after execution of the previous user command. The subsequent user command could re-enable the oscillator circuit and restart the micro controller during shut down. Such a premature re-enable of the oscillator circuit could cause a partial reset of the micro controller. The partial reset could cause the micro controller to restart in an unknown state.

SUMMARY AND OBJECTS OF THE INVENTION

One object of the present invention is to synchronize the start-up and shut down sequences of a micro controller in a flash memory device during transfer of user commands to the flash memory device.

Another object of the present invention is to coordinate the start-up and shut down sequences of the micro controller such that a user command received during shut down does not cause a partial reset of the micro controller.

Another object of the present invention is to shut down the micro controller and disable an oscillator circuit for the micro controller if a user command specifying an operation on a flash cell array in the flash memory device is not pending.

A further object of the present invention is to shut down the micro controller and disable an oscillator circuit if a user command is not pending in a temporary queue or an operation queue to the micro controller.

These and other objects of the invention are provided by a method and apparatus for synchronizing a micro controller in a flash memory device. An interface circuit receives a user command over a host bus, and stores the user command in an operation queue to the micro controller. A synchronizer circuit enables an oscillator circuit if the user command specifies an operation on a flash cell array. The oscillator circuit generates a clock signal for the micro controller.

The synchronizer circuit receives a halt signal from the micro controller. The halt signal indicates that the operation is complete. The synchronizer circuit then disables the oscillator circuit if a subsequent user command that specifies a subsequent operation for the micro controller is not pending.

Other objects, features and advantages of the present invention will be apparent from the accompanying drawings, and from the detailed description that follows below.

BRIEF DESCRIPTION OF THE DRAWINGS

The present invention is illustrated by way of example and not limitation in the figures of the accompanying drawings in which like references indicate similar elements, and in which.

DETAILED DESCRIPTION

Figure 1:
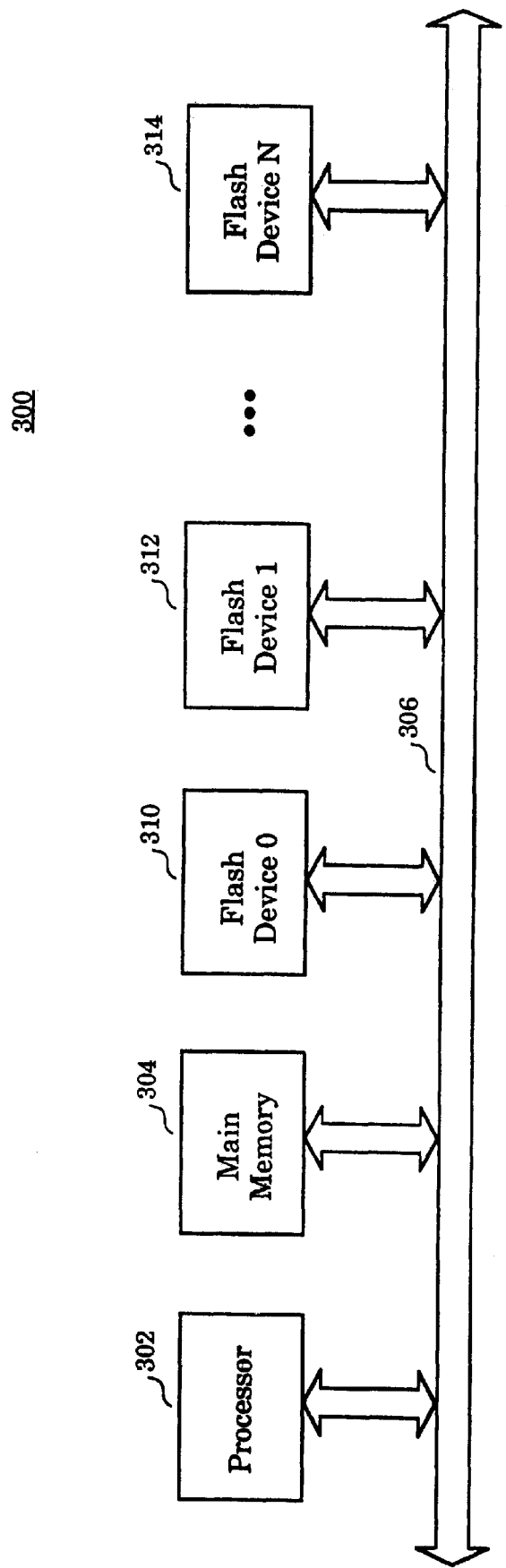
FIG. 1 is a block diagram of a computer system comprising a processor, a main memory subsystem, and a set of flash memory devices.

FIG. 1 is a block diagram of a computer system 300. The computer system 300 comprises a processor 302, a main memory subsystem 304, and a set of flash memory devices 310–314. The processor 302 communicates with the main memory subsystem 304 and the flash memory devices 310–314 over a user bus 306.

The flash memory devices 310–314 provide random access non-volatile large scale data storage for the computer system 300. The processor 302 reads the contents of the flash memory devices 310–314 by performing read access cycles over the user bus 306. The processor 302 writes to the flash memory devices 310–314 by transferring write commands and write data blocks to the flash devices 310–314 over the user bus 306.

Figure 2:
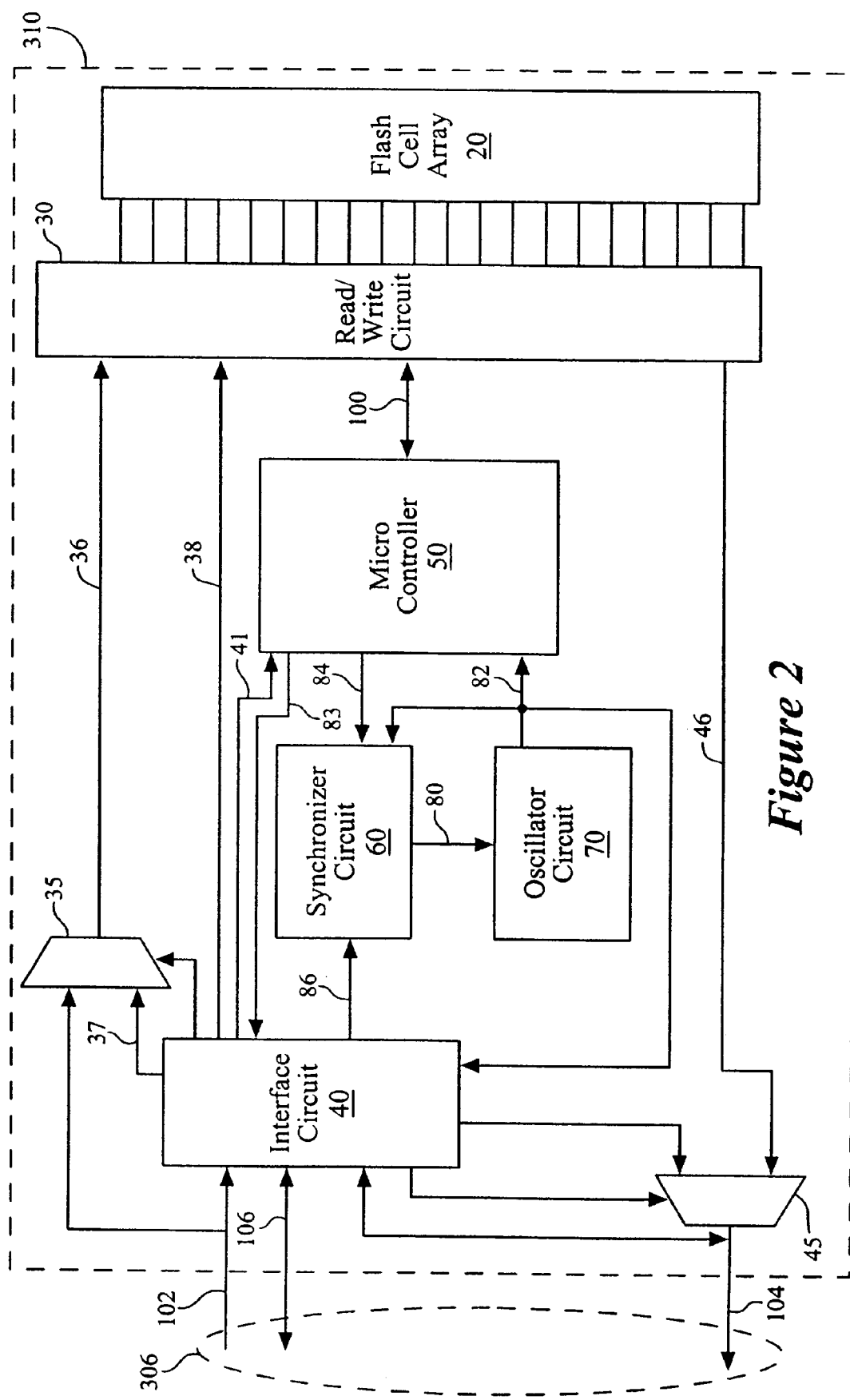
FIG. 2 illustrates a flash memory device which comprises a flash cell array, a read/write circuit, an interface circuit, a micro controller, a synchronizer circuit, and an oscillator circuit.

FIG. 2 illustrates the flash memory device 310. The flash memory device 310 comprises a flash cell array 20, a read/write circuit 30, an interface circuit 40, a micro controller 50, a synchronizer circuit 60, and an oscillator circuit 70. The flash memory device 310 is coupled for communication over the user bus 306. The user bus 306 comprises a user address bus 102, a user data bus 104 and a user control bus 106.

The flash cell array 20 provides random access non-volatile data storage. For one embodiment, the flash cell array 20 comprises a set of 32 flash array blocks wherein each flash array block provides 64 k bytes of data storage.

The read/write circuit 30 contains read path circuitry and write path circuitry for accessing the flash cell array 20. The read/write circuit 30 contains row and column addressing circuitry for the flash cell array 20 as well as circuitry for generating reference flash bits and sense path circuitry for comparing the reference flash bits to bits from the flash cell array 20 to determine whether the bits of the flash cell array 20 are logic state 0 or logic state 1.

The read/write circuit 30 contains multiplexer circuitry for selecting between high and low bytes of the flash cell array 20 during 8 bit and 16 bit accesses over the user bus 306. The read/write circuit 30 contains output buffer circuitry for driving data from the flash cell array 20 over the output pads of the flash memory device 310. The read/write circuit 30 contains high voltage circuitry for performing writes to the flash cell array 20.

The interface circuit 40 enables user access to the flash cell array 20 over the user bus 306. The interface circuit 40 receives user commands and data over the user bus 306. The user commands include commands for performing program and erase operations on the flash cell array 20.

The processor 302 writes data into the flash cell array 20 by generating write cycles over the user bus 306 to transfer user commands and data to the interface circuit 40. The command specify program operations to the flash cell array 20.

The interface circuit 40 verifies the user commands. If a user command requires execution by the micro controller 50, the interface circuit 40 transfers a corresponding command offset value to the micro controller 50 over a controller bus 41. The user commands requiring execution by the micro controller 50 include commands for performing program or erase operations to the flash cell array 20.

The interface circuit 40 controls an output data multiplexer 45. The output data multiplexer 45 selects a source for driving output data onto the user data bus 104. The selected output data is either an output data 46 from the flash cell array 20 through the read/write circuit 30 or a status register data 48 from a set of status registers implemented in the interface circuit 40.

The processor 302 reads the flash cell array 20 by transferring addresses over the user address bus 102 and signaling a read access cycle on the user control bus 106. The interface circuit 40 recognizes the read cycles and causes an input address multiplexer 35 to transfer the addresses from the user address bus 102 to the x and y address decode circuitry in the read/write circuit 30 over a bus 36. The interface circuit 40 causes the output data multiplexer 45 to transfer the resulting read data from the flash cell array 20 over the user data bus 104.

The micro controller 50 is a reduced instruction set processor for performing program and erase as well as other operations on the flash cell array 20. The micro controller 50 implements an arithmetic logic unit, a set of general purpose registers, and a control store and a control sequencer for implementing flash programming algorithms. The micro controller 50 uses the command offset values received over the control bus 41 to access the appropriate location of the control store that contains a routine performing the specified operation. The micro controller 50 uses the command offset values as pointers for dispatching the control sequencer to the appropriate routine.

The micro controller 50 implements algorithms for controlling the high voltage circuits in the read/write circuit 30 that apply charge to the flash cells of the flash cell array 20 and that remove charge from the flash cells of the flash cell array 20. The micro controller 50 sequences the high voltage circuitry and selects the flash cells of the flash cell array 20 through the read/write circuit 30.

The flash memory device 310 includes an input control pin (not shown) coupled to the user control bus 106. The user drives the input control pin over the user control bus 106 to indicate either an 8 bit mode or a 16 bit mode. The 8 bit mode or 16 bit mode determines the width of data values transferred over the user data bus 104. The interface circuit 40 senses the state of the input control pin to determine whether the width of the user data values.

The oscillator circuit 70 generates a set of micro controller clock signals (FACLKS) 82. The FACLKS 82 synchronize the operation of the micro controller 50. The oscillator circuit 70 is controlled by an enable oscillator signal 80 from the synchronizer circuit 60.

The synchronizer circuit 60 generates the enable oscillator signal 80 to control the oscillator circuit 70. The enable oscillator signal 80 enables and disables generation of the FACLKS 82. The synchronizer circuit 60 receives a set of sync control signals 86 from the interface circuit 40. The sync control signals 86 indicate the status of user data and user commands received over the user bus 306. The sync control signals 86 also indicate whether a user command received over the user bus 306 requires processing by the micro controller 50.

The synchronizer circuit 60 also receives a micro controller halt signal 84 from the micro controller 50. The micro controller halt signal 84 indicates whether or not the micro controller circuit 50 is running.

The synchronizer circuit 60 asserts the enable oscillator signal 80 if a user command requires processing by the micro controller 50. The enable oscillator signal 80 causes the oscillator circuit 70 to generate the FACLKS 82 and startup the micro controller 50. The micro controller 50 starts up and accesses the user command from the interface circuit 40. The micro controller 50 receives a command offset corresponding to the user command over an operation queue bus 41.

The micro controller 50 generates the micro controller halt signal 84 after executing the user command and performing the specified program or erase operation on the flash cell array 20. The micro controller 50 generates the micro controller halt signal 84 if no other user commands are available from the operation queue of the interface circuit 40.

The micro controller halt signal 84 causes the synchronizer circuit 60 to deassert the enable oscillator signal 80 and shut down the oscillator circuit 70. The interface circuit 40 issues the sync control signals 86 to prevent shutdown of the oscillator circuit 70 if another user command requiring execution by the micro controller 50 is being received. The sync control signals 86 from the interface circuit 40 ensure that the enable oscillator signal 80 does not cause partial resets of the micro controller 50.

Figure 3:
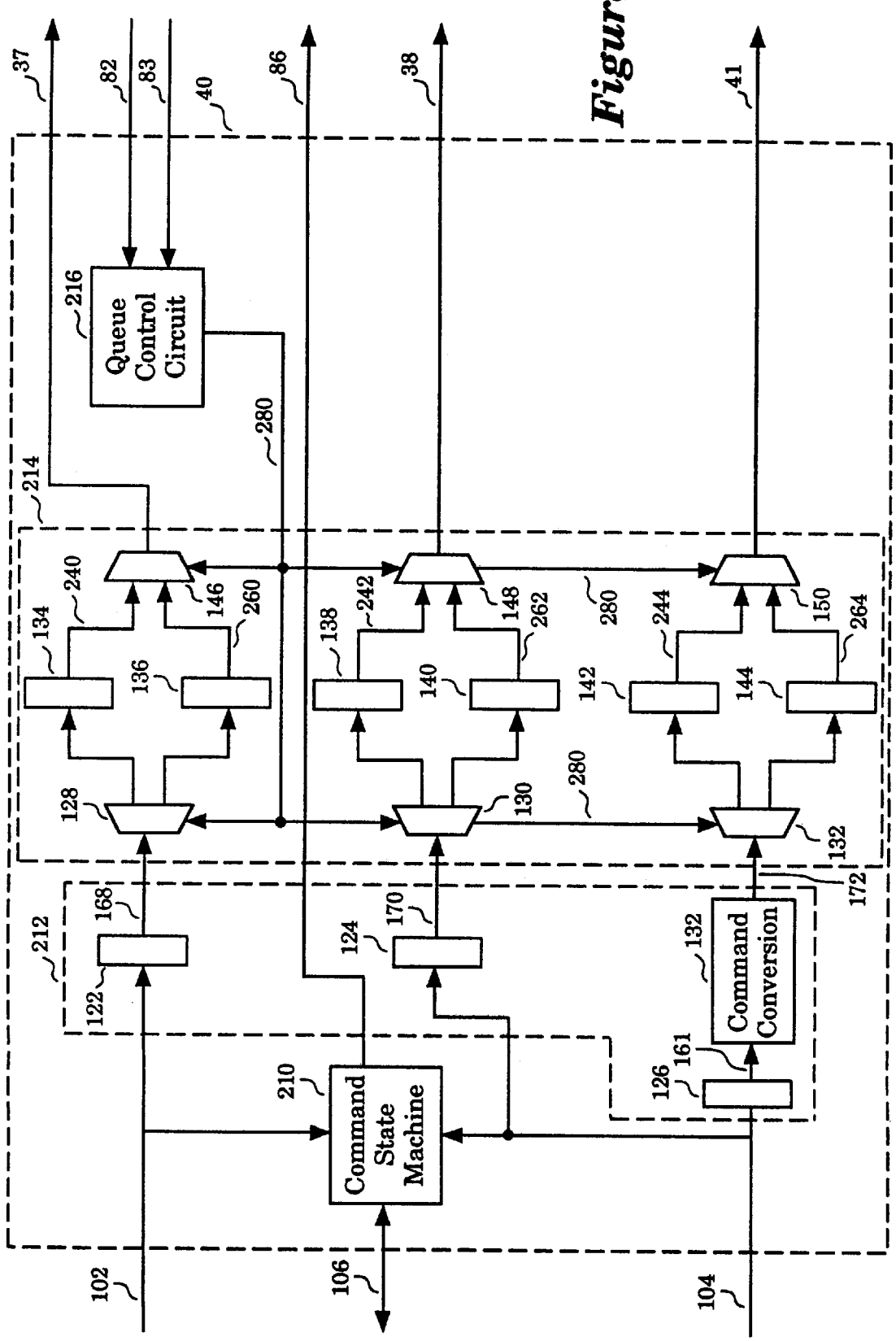
FIG. 3 illustrates an interface circuit comprising a command state machine, a temporary queue circuit, and an operation queue circuit.

FIG. 3 illustrates the interface circuit 40. The interface circuit 40 comprises a command state machine 210, a temporary queue circuit 212, and an operation queue circuit 214.

The command state machine 210 receives and verifies each user commands over the user data bus 106. A user command that specifies a program or erase operation on the flash cell array 20 requires processing by the micro controller 50. The command state machine 210 loads the program or erase user command into the temporary queue circuit 212. The command state machine 210 also loads the associated user address and user data parameters into the temporary queue circuit 212.

The command state machine 210 generates the sync control signals 86 for the synchronizer circuit 60. The sync control signals 86 cause the synchronizer circuit 60 to enable the oscillator circuit 70 for a user command that requires execution by the micro controller 50. The sync control signals 86 also cause the synchronizer circuit 60 to disable the oscillator circuit 70 if a user command requiring execution by the micro controller 50 is not pending.

The temporary queue circuit 212 comprises a temporary address register 122, a temporary data register 124, a temporary command register 126, and a command conversion circuit 132. The temporary address register 122, the temporary data register 124, and the temporary command register 126 hold a temporary queue entry for a program or erase operation that requires execution by the micro controller 50.

The command state machine 210 generates a two phase interface circuit clock signal (ICΦ 1 and ICΦ2). The two phase interface circuit clock signal (ICΦ1 and ICΦ2) reflects the timing of a write enable control signal on the user control bus 106. The write enable control signal is valid low (WEB), and synchronizes command, data, and address transfer over the user bus 306.

The temporary data register 124 stores a user data value for a temporary queue entry. The temporary data register 124 receives the user data value over the user data bus 104. The command state machine 210 synchronizes the loading of the temporary data register 124.

The temporary command register 126 stores a user command for a temporary queue entry. The temporary command register 126 receives the user command over the user data bus 104. The command state machine 210 synchronizes the loading of the temporary command register 126.

The command conversion circuit 132 receives a user command 161 from the temporary command register 126. The command conversion circuit 132 generates a command offset value 172. The command offset value 172 is generated by mapping the user command 161 into one of 32 jump vectors for the micro controller 50. The command offset value 172 specifies one of the first 32 entries of code storage for the micro controller 50. The micro controller 50 will use the command offset value to dispatch to the routine for processing the corresponding program or erase operation.

The operation queue circuit 214 comprises a queue control circuit 216 and a set of registers 134–144. The operation queue circuit 214 provides a primary queue slot and a secondary queue slot for holding a user command and associated data and address parameters. The registers 134, 138, and 142 hold a queue operation for a primary queue slot of the micro controller 50. The registers 136, 140, and 144 hold information for a secondary queue slot to the micro controller 50.

The queue control circuit 216 controls loading of the primary and secondary queue slots in the operation queue circuit 214. The queue control circuit 216 generates the control signals 280 to load queue operations into either the primary or the secondary queue slot according to the availability of the queue slots.

The queue control circuit 216 receives a queue select signal 83 from the micro controller 50. The queue select signal 83 indicates whether the micro controller 50 is accessing the primary or secondary queue slot in the operation queue 214. The queue control circuit 216 generates a set of control signals 280 to select either the primary or secondary queue slot in the operation queue 214 according to the queue select signal 83.

The register 134 stores a user address parameter for the primary queue slot and the register 136 stores a user address parameter for the secondary queue slot. A multiplexer 128 receives an address parameter 168 from the temporary address register 122. The multiplexer 128 selectively couples the address parameter 168 to either the register 134 or the register 136 according to the control signals 280 from the queue control circuit 216.

The register 138 stores a user data parameter for the primary queue slot and the register 140 stores user data parameter for the secondary queue slot of the operation queue 214. A multiplexer 130 selectively couples a data parameter 170 from the temporary data register 124 to either the register 138 or the register 140 according to the control signals 280.

The register 142 stores a command offset value for the primary queue slot and the register 144 stores a command offset value for the secondary queue slot of the operation queue circuit 214. A multiplexer 132 selectively couples an offset value 172 from the command conversion circuit 132 to either the register 142 or the register 144 according to the control signals 280.

The queue control circuit 216 transfers queue operations from the operation queue circuit 214 to the micro controller 50 by switching a set of multiplexers 146–150. The queue control circuit 216 switches the multiplexers 146–150 by issuing the control signals 280. The multiplexer 146 transfers either a primary queue address 240 or a secondary queue address 260 over a queue address bus 37. The command state machine 210 causes the input multiplexer 35 to transfer the primary or secondary address on the queue address bus 37 to the read/write circuit 30 over the bus 36.

The queue control circuit 216 causes the multiplexer 146 to transfer the primary queue address 240 over the queue address bus 37 if the queue select signal 83 indicates that the micro controller 50 is accessing the primary queue slot. The queue control circuit 216 causes the multiplexer 146 to transfer the secondary queue address 260 over the queue address bus 37 if the queue select signal 83 indicates that the micro controller 50 is accessing the secondary queue slot.

The multiplexer 148 selectively couples either a primary queue data value 242 or a secondary queue data value 262 to a queue data bus 38 according to the control signals 280 from the queue control circuit 216. The queue control circuit 216 causes the multiplexer 148 to transfer the primary queue data value 242 over the queue data bus 38 if the queue select signal 83 indicates that the micro controller 50 is accessing the primary queue slot. The multiplexer 148 transfers the secondary queue data value 262 over the queue data bus 38 if the micro controller 50 is accessing the secondary queue slot.

The multiplexer 150 selectively couples a primary queue command offset 244 or a secondary queue command offset 264 to a queue offset bus 41. The queue control circuit 216 generates the control signals 280 to couple the primary queue command offset 244 to the queue offset bus 41 if the queue select signal 83 indicates that the micro controller 50 is accessing the primary queue slot. The control signals 280 cause the multiplexer 150 to couple the secondary queue command offset 264 to the queue offset bus 41 if the micro controller 50 is accessing the secondary queue slot.

Figure 4:
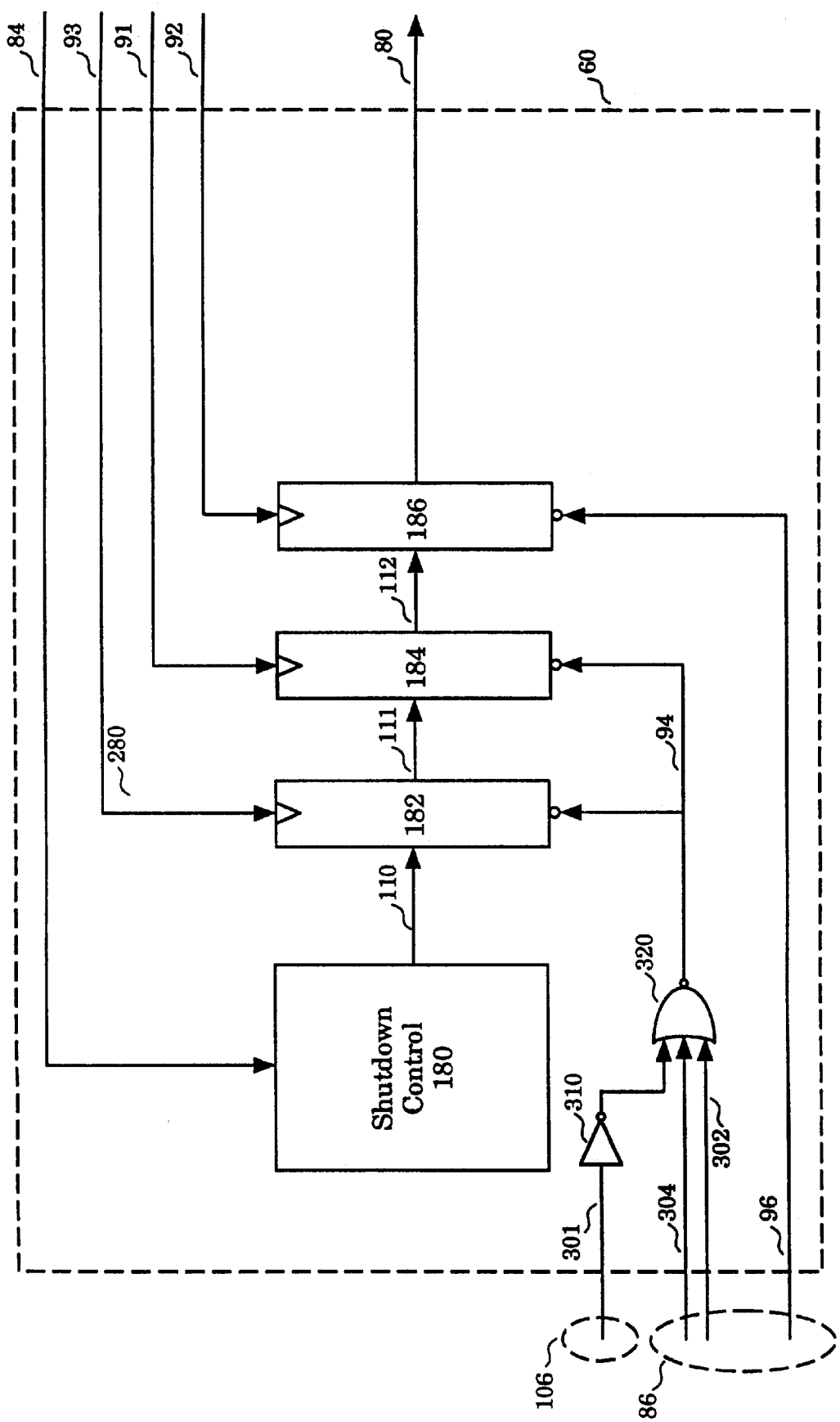
FIG. 4 illustrates a synchronizer circuit which comprises a shutdown control circuit and a set of synchronized registers.

FIG. 4 illustrates the synchronizer circuit 60. The synchronizer circuit 60 comprises a shutdown control circuit 180 and a set of registers 182–186. The registers 182–186 are synchronized by the FACLKS 82. The FACLKS 82 comprise a phase one clock signal 91, a phase two clock signal 92, and a phase three clock signal 93.

The phase one clock signal 91 synchronizes the register 184, the phase two clock signal 92 synchronizes the register 186 and the shut-down control circuit 180, and the phase three clock signal 93 synchronizes the register 182.

The shutdown control circuit 180 receives the micro controller halt signal 84 from the micro controller 50. The shutdown control circuit 180 generates an oscillator disable signal 110 synchronized by the phase two clock signal 92. The oscillator disable signal 110 is loaded into the register 182 by the phase three clock signal 93 to generate an oscillator disable signal 111. The oscillator disable signal 111 is loaded into the register 184 by the phase one clock signal 91 to generate an oscillator disable signal 112. The oscillator disable signal 112 is loaded into the register 184 by the phase two clock signal 92 to cause a high to low transition of the oscillator enable signal 80. The low level of the oscillator enable signal 80 disables the oscillator circuit 70.

The commands state machine 210 generates a run micro controller signal 96 to enable the oscillator circuit 70. A NOR gate 320 generates an oscillator sync signal 94 to coordinate the shutdown of the oscillator circuit 70 by the synchronizer circuit 60. The run micro controller signal 96 clears the register 186 and causes the oscillator enable signal 80 to go high. The high level of the oscillator enable signal 80 enables the oscillator circuit 70.

The oscillator sync signal 94 prevents the micro controller halt signal 84 from disabling the oscillator circuit 70. The oscillator sync signal 94 clears the registers 182 and 184 and prevents the oscillator disable signals 110 and 111 from propagating to the register 86. The NOR gate 320 receives the WEB signal 301 through an inverter 310, and a control signal 304 from the command state machine 210 indicating whether a user command requiring execution by the micro controller 50 is received over the user data bus 104, and a temporary queue full (TEMPQF) signal 302 from the command state machine 210 indicating whether the temporary queue 212 is full. The oscillator sync signal 94 clears the registers 182 and 184 if the write enable WEB signal on the user control bus 106 is low, or if a user command requiring execution by the micro controller 50 is received over the user data bus 104, or if the temporary queue 212 is full.

Figure 5:
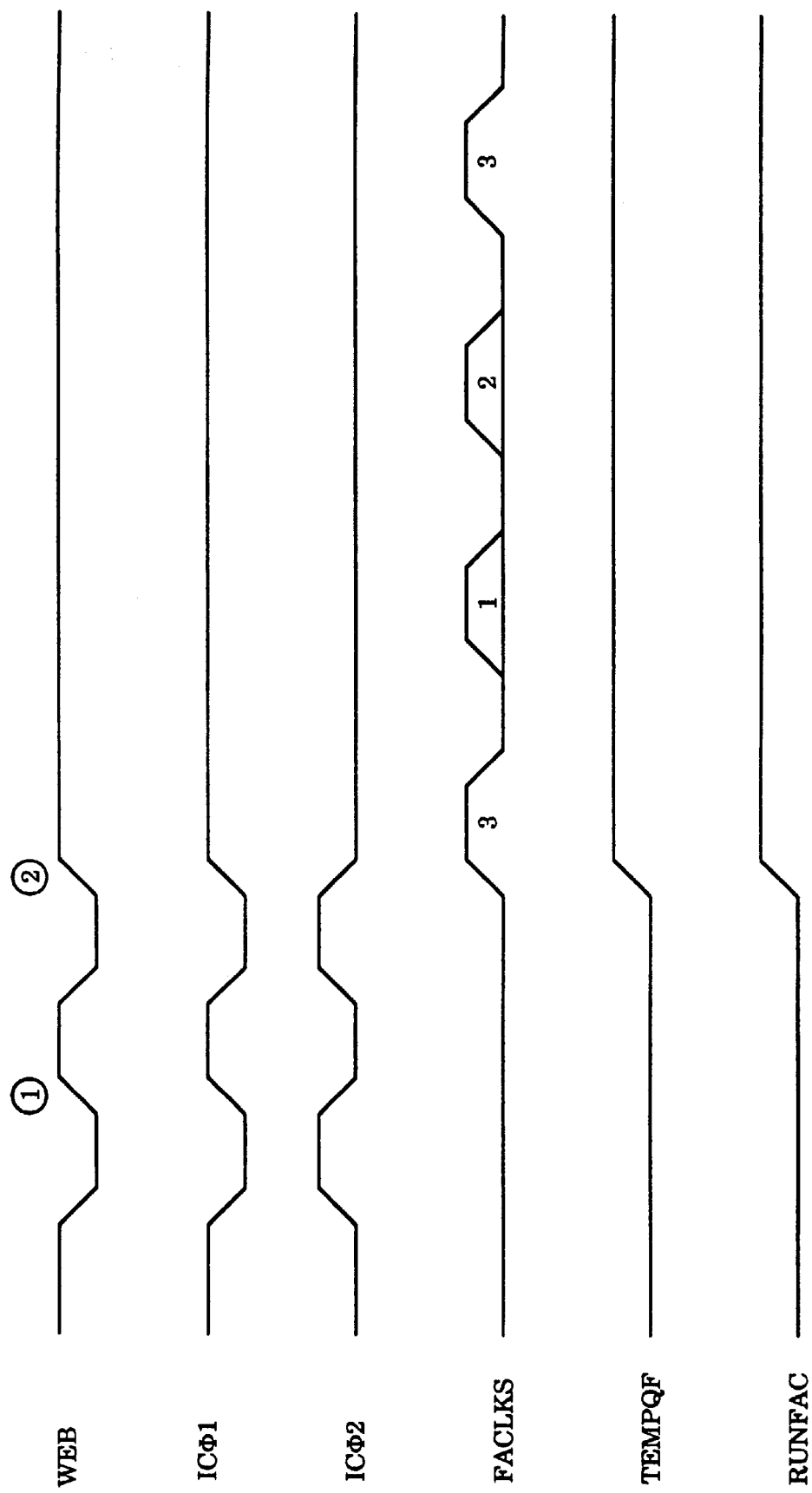
FIG. 5 illustrates a start-up sequence of the micro controller and shows the micro controller timing in relation to a write enable signal (WEB) on the user control bus.

FIG. 5 illustrates a start-up sequence of the micro controller 50, and shows the timing of a write enable signal (WEB) on the user control bus 106, the interface circuit phase clocks (ICΦ1 and ICΦ2), the FACLKS 82, temporary queue full signal (TEMPQF), and the run micro controller (RUNFAC) signal 96. The TEMPQF signal indicates whether a user operation is loaded into the temporary queue 212. The command state machine 210 senses the WEB signal on the user control bus 106 and generates the ICΦ1 and ICΦ2 interface circuit clock signals.

At time 1, the command state machine 210 receives a user command over the user bus 306 at the low to high transition of the write enable signal WEB. The command state machine 210 determines that the user command requires execution by the micro controller 50, and loads the user command into the register 126.

At time 2, the low to high transition of the write enable signal WEB causes the command state machine 210 to load the user address on the user address bus 102 and the user data on the user data bus 104 into the registers 122 and 124. The TEMPQF goes high to indicate that an operation is loaded into the temporary queue 212.

The command state machine 210 also generates the RUNFAC signal 96. The RUNFAC signal 96 clears the register 186, thereby causing the synchronizer circuit 60 to assert the enable oscillator signal 80 and start up the FACLKS 82. The FACLKS 82 start-up with the phase three clock 93 followed by the phase one 91 and the phase two clock 92 in sequence.

The FACLKS 82 cause the micro controller 50 to start up and access the user command and associated address and data parameters from the interface circuit 40. Thereafter, the FACLKS 82 causes the queue control circuit 216 to transfer the operation from the temporary queue 212 to an available queue slot in the operation queue 214. The transfer of the operation from the temporary queue 212 to the operation queue 214 resets the TEMPQF signal.

Figure 6:
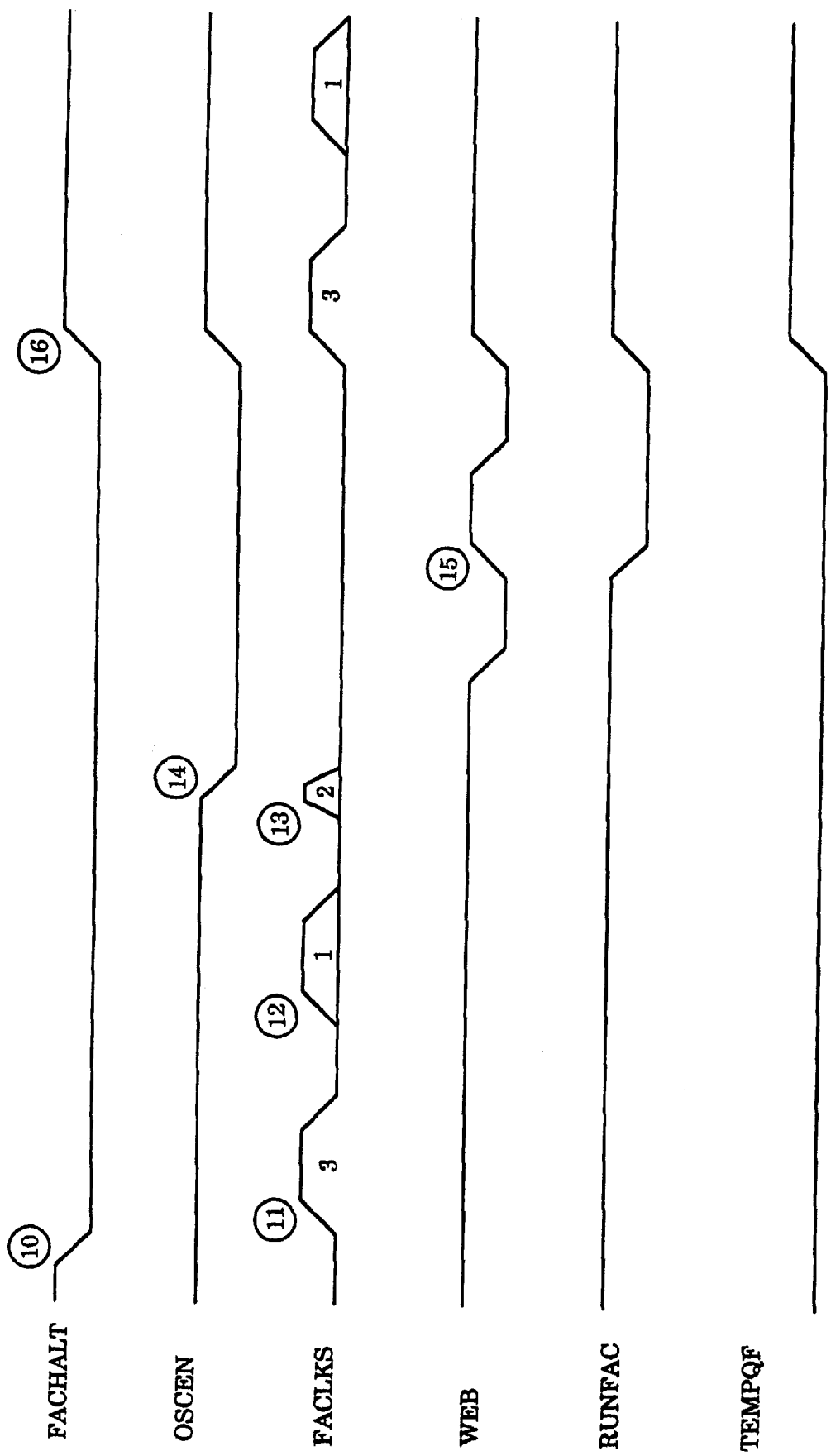
FIG. 6 illustrates a shutdown sequence of the micro controller and a receipt of a subsequent user command.

FIG. 6 illustrates a shutdown sequence of the micro controller 50 and a receipt of a subsequent user command. At time 10, the micro controller 50 generates a high to low transition of the micro controller halt (FACHALT) signal 84 to indicate that the user program or erase operation corresponding to the user command received at time 1 has completed.

The shutdown control circuit 180 receives the FACHALT signal 84, and generates the oscillator disable signal 110 synchronized by the phase two clock signal 92. At time 11, the phase three clock signal 93 loads the oscillator disable signal 110 into the register 182. At time 12, the phase one clock signal 91 loads the oscillator disable signal 111 into the register 184. At time 13, the phase two clock signal 92 loads the oscillator disable signal 112 into the register 184 and causes a high to low transition of the oscillator enable signal 80. The low level of the oscillator enable signal 80 disables the oscillator circuit 70.

At time 14, the oscillator enable signal 80 disables the oscillator circuit 70 and terminates the phase two clock signal 92. Thereafter, all of the FACLKS 82 are disabled.

At time 15, the command state machine 210 receives another user command over the user bus 306 at the low to high transition of the write enable signal WEB. The command state machine 210 determines that the user command requires execution by the micro controller 50, and loads the user command into the register 126.

At time 16, the command state machine 210 loads the user address on the user address bus 102 and the user data on the user data bus 104 into the registers 122 and 124. The TEMPQF goes high to indicate an operation loaded into the temporary queue 212. The command state machine 210 generates the RUNFAC signal 96 which causes the synchronizer circuit 60 to assert the enable oscillator signal 80 and enable the oscillator circuit 70. The FACLKS 82 start-up with the phase three clock 93 followed by the phase one 91 in sequence.

Figure 7:
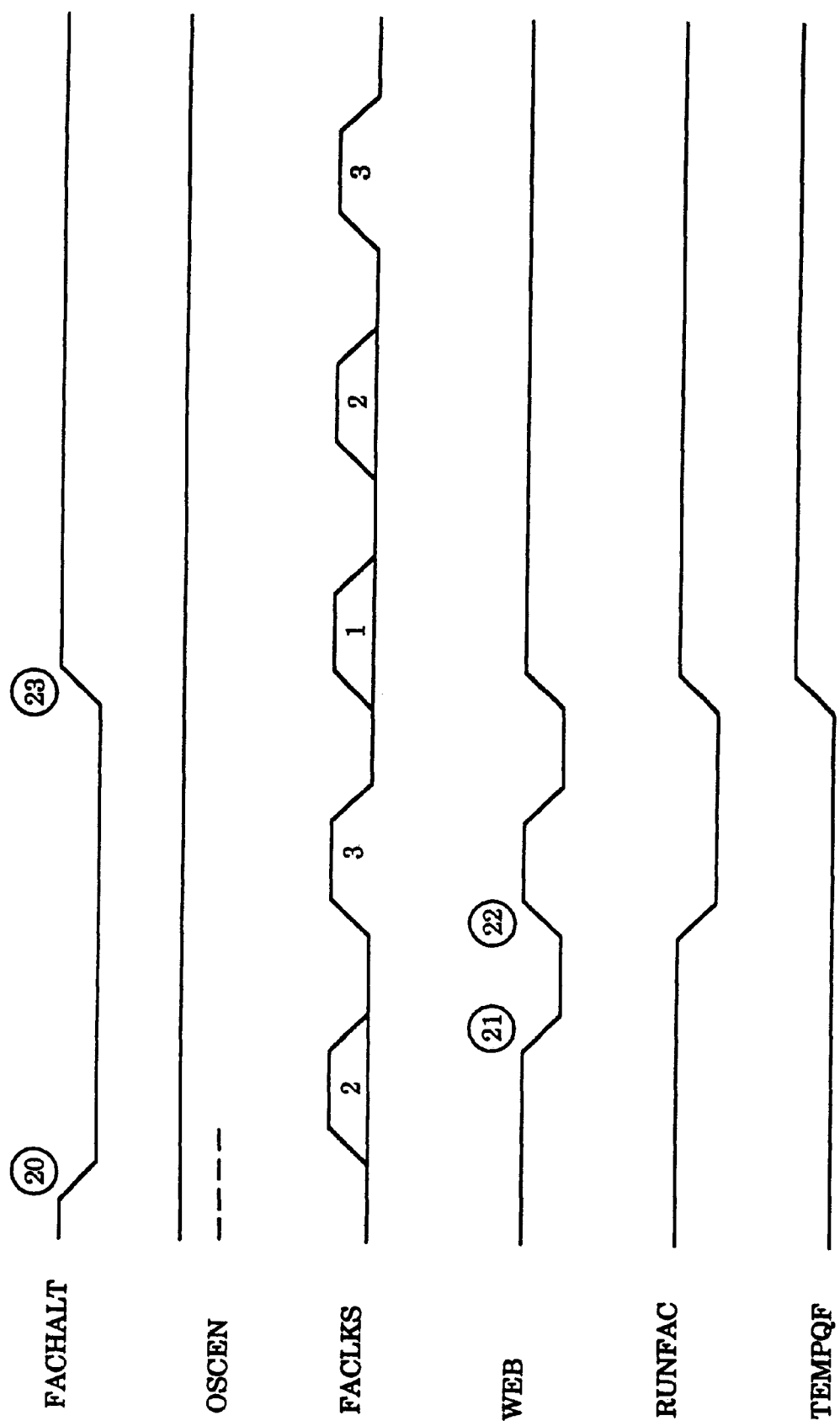
FIG. 7 illustrates an aborted shutdown of the micro controller during receipt of a subsequent user command.

FIG. 7 illustrates an aborted shutdown of the micro controller 50 during receipt of a subsequent user command. At time 20, the micro controller 50 generates a high to low transition of the FACHALT signal 84 to indicate that the user program or erase operation corresponding to the user command received at time 1 has completed. The shutdown control circuit 180 receives the FACHALT signal 84, and generates the oscillator disable signal 110 synchronized by the phase two clock signal 92.

At time 21, the WEB signal goes low indicating a transfer of a user command over the user bus 306. The low WEB signal at time 21 causes the NAND gate 320 to generate the oscillator sync signal 94. The oscillator sync signal 94 clears the registers 182 and 184 and prevents the oscillator disable signals 110 and 111 from propagating to the register 86.

At time 22, the command state machine 210 receives another user command over the user bus 306 at the low to high transition of the write enable signal WEB. The command state machine 210 determines that the user command requires execution by the micro controller 50, and loads the user command into the register 126. The command state machine 210 maintains the oscillator sync signal 94 which clears the registers 182 and 184 and prevents disabling of the oscillator circuit 70.

At time 23, the command state machine 210 loads the user address and the user data on the user bus 306 into the registers 122 and 124. The TEMPQF goes high to indicate an operation loaded into the temporary queue 212. The command state machine 210 generates the RUNFAC signal 96 to maintain the enable oscillator signal 80 and keep the oscillator circuit 70 enabled.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are accordingly to be regarded as illustrative rather than a restrictive sense.

What is claimed is:

1. A method for reducing the power consumed by a micro controller in a flash memory device, comprising:
   receiving a user command over a host bus and storing the user command in an operation queue;
   enabling an oscillator circuit if the user command specifies a operation on a flash cell array by the micro controller, the oscillator circuit generating a clock signal for clocking the micro controller;
   disabling the oscillator circuit when the operation is complete if a subsequent user command is not being received over the host bus.

2. The method of claim 1, wherein receiving a user command over a host bus and storing the user command in an operation queue comprises:
   receiving the user command over the host bus synchronized by a write enable signal on a host bus, and storing the user command in a temporary queue;
   receiving an address and a data value for the operation over the host bus synchronized by the write enable signal, and storing the address and the data value in the temporary queue.

3. The method of claim 2, wherein enabling an oscillator circuit if the user command specifies an operation on a flash cell array by the micro controller comprises:
   generating a temporary queue full signal indicating that the temporary queue holds the user command and the address and the data value for the operation;
   generating a run micro controller signal, the run micro controller signal enabling the oscillator circuit to generate the clock signal, such that the clock signal causes transfer of the user command and the address and the data value to an operation queue and resets the temporary queue full signal.

4. The method of claim 3, wherein the micro controller reads the user command and the address and the data value for the operation from the operation queue and performs the operation on the flash cell array.

5. The method of claim 4, wherein the clock signal is a three phase clock sequence comprising a first phase clock, a second phase clock, and a third phase clock.

6. The method of claim 5 further comprising receiving a halt signal from the micro controller wherein receiving a halt signal from the micro controller includes:
   receiving the halt signal and propagating the halt signal to a first buffer in synchronizing with the second phase clock;
   propagating the halt signal to a second buffer in synchronization with the third phase clock;
   propagating the halt signal to a third buffer in synchronization with the first phase clock;
   generating an oscillator disable signal by propagating the halt signal from the third buffer in synchronization with the second phase clock.

7. The method of claim 6, wherein disabling the oscillator circuit when the operation is complete if a subsequent user command specifying a subsequent operation is not being received over the host bus comprises:
   resetting the halt signal during the third phase clock, if the write enable signal is active during the third phase clock, or if the subsequent user command specifying the subsequent operation is being received over the host bus during the third phase clock, or if the temporary queue full signal indicates that the temporary queue is not empty during the third phase clock;
   resetting the halt signal during the first phase clock if the write enable signal is active during the first phase clock, or if the subsequent user command specifying the subsequent operation is being received over the host bus during the first phase clock, or if the temporary queue full signal indicates that the temporary queue is not empty during the first phase clock;
   resetting the halt signal during the second phase clock if the run micro controller signal is not active.

8. A circuit for reducing the power consumed by a micro controller in a flash memory device, comprising:
   circuit for receiving a user command over a host bus and storing the user command in an operation queue;
   circuit for enabling an oscillator circuit if the user command specifies an operation on a flash cell array by the micro controller, the oscillator circuit generating a clock signal for clocking the micro controller;
   circuit for disabling the oscillator circuit when the operation is complete if a subsequent user command is not being received over the host bus.

9. The circuit of claim 8, wherein the circuit for receiving a user command over a host bus and storing the user command in an operation queue comprises:

circuit for receiving the user command over the host bus synchronized by a write enable signal on the host bus, and storing the user command in a temporary queue;

circuit for receiving an address and a data value for the operation over the host bus synchronized by the write enable signal, and storing the address and the data value in the temporary queue.

10. The circuit of claim 9, wherein the circuit for enabling an oscillator circuit if the user command specifies an operation on a flash cell array by the micro controller comprises:

circuit for generating a temporary queue full signal indicating that the temporary queue holds the user command and the address and the data value for the operation;

circuit for generating a run micro controller signal, the run micro controller signal enabling the oscillator circuit to generate the clock signal, such that the clock signal causes transfer of the user command and the address and the data value to an operation queue and resets the temporary queue full signal.

11. The circuit of claim 10, wherein the micro controller reads the user command and the address and the data value for the operation from the operation queue and performs the operation on the flash cell array.

12. The circuit of claim 11, wherein the clock signal is a three phase clock sequence comprising a first phase clock, a second phase clock, and a third phase clock.

13. The circuit of claim 12 further comprising a circuit for receiving a halt signal from the micro controller, the circuit for receiving a halt signal from the micro controller including circuit for receiving the halt signal and propagating the halt signal to a first buffer in synchronization with the second phase clock;

circuit for propagating the halt signal to a second buffer in synchronization with the third phase clock;

circuit for propagating the halt signal to a third buffer in synchronization with the first phase clock;

circuit for generating an oscillator disable signal by propagating the halt signal from the third buffer in synchronization with the second phase clock.

14. The circuit of claim 13, wherein the circuit for disabling the oscillator circuit when the operation is complete if a subsequent user command is not being received over the host bus comprises:

circuit for resetting the halt signal during the third phase clock if the write enable signal is active during the third phase clock, or if the subsequent user command specifying a subsequent operation is being received over the host bus during the third phase clock, or if the temporary queue full signal indicates that the temporary queue is not empty during the third phase clock;

circuit for resetting the halt signal during the first phase clock if the write enable signal is active during the first phase clock, or if the subsequent user command specifying the subsequent operation is being received over the user bus during the first phase clock, or if the temporary queue full signal indicates that the temporary queue is not empty during the first phase clock;

circuit for resetting the halt signal during the second phase clock if the run micro controller signal is not active.

15. A flash memory device, comprising:

interface circuit coupled to receive a user command over a host bus, the interface circuit storing the user command in an operation queue;

oscillator circuit for generating a clock signal that clocks a micro controller;

synchronizer circuit for enabling the oscillator circuit if the user command specifies an operation on a flash cell array by the micro controller, the synchronizer circuit disabling the oscillator circuit when the operation is complete if a subsequent user command is not being received over the host bus.

16. The flash memory device of claim 15, wherein the interface circuit comprises:

command state machine detecting the user command on the host bus synchronized by a write enable signal on the host bus;

temporary queue circuit storing the user command, the temporary queue circuit receiving an address and a data value for the operation over the host bus synchronized by the write enable signal, and storing the address and the data value.

17. The flash memory device of claim 16, wherein the command state machine comprises:

circuit for generating a temporary queue full signal indicating that the temporary queue holds the user command and the address and the data value for the operation;

operation queue circuit for buffering the operation;

circuit for generating a run micro controller signal, the run micro controller signal enabling the oscillator circuit to generate the clock signal, such that the clock signal causes transfer of the user command and the address and the data value to the operation queue circuit and resets the temporary queue full signal.

18. The flash memory device of claim 17, wherein the micro controller reads the user command and the address and the data value for the operation from the operation queue circuit and performs the operation on the flash cell array.

19. The flash memory device of claim 18, wherein the clock signal is a three phase clock sequence comprising a first phase clock, a second phase clock, and a third phase clock.

20. The flash memory device of claim 19, wherein the synchronizer circuit comprises:

circuit for receiving a halt signal from the micro controller, the halt signal indicating that the operation is complete, and propagating the halt signal to a first register circuit in synchronization with the second phase clock;

second register circuit for receiving the halt signal from the first register circuit in synchronization with the first phase clock and propagating the halt signal to a third register circuit in synchronization with the third phase clock, the third register circuit for generating an oscillator disable signal in synchronization with the second phase clock.

21. The flash memory device of claim 20, wherein the interface circuit further comprises:

circuit for resetting the halt signal during the first phase clock if the write enable signal is active during the third phase clock, or if the subsequent user command specifying a subsequent operation is being received over the user bus during the third phase clock, or if the temporary queue full signal indicates that the temporary queue is not empty during the third phase clock;

circuit for resetting the halt signal during the first phase clock if the write enable signal is active during the first phase clock, or if the subsequent user command specifying the subsequent operation is being received over the user bus during the first phase clock, or if the temporary queue full signal indicates that the temporary queue is not empty during the first phase clock;

circuit for resetting the halt signal during the second phase clock if the run micro controller signal is not active.

22. A computer system, comprising:

main memory means storing at least one data value for a program operation;

central processing means transferring a user command over a host bus;

flash memory device receiving the user command over the host bus, storing the user command in an operation queue, and enabling an oscillator circuit if the user command specifies an operation on a flash cell array by a micro controller, the oscillator circuit generating a clock signal for clocking the micro controller, wherein the oscillator circuit is disabled when the operation is complete if a subsequent user command is not being received over the host bus.

23. The computer system of claim 22, wherein the flash memory device comprises:

interface circuit coupled to receive the user command over the host bus, the interface circuit storing the user command in the operation queue;

oscillator circuit for generating the clock signal that clocks the micro controller;

synchronizer circuit for enabling the oscillator circuit if the user command specifies the operation on a flash cell array by the micro controller, the synchronizer circuit receiving a halt signal from the micro controller, the halt signal indicating that the operation is complete, the synchronizer circuit disabling the oscillator circuit after receiving the halt signal if the subsequent user command that specifies a subsequent operation for the micro controller is not pending in the operation queue.

24. The computer system of claim 23, wherein the interface circuit comprises:

command state machine detecting the user command on the host bus synchronized by a write enable signal on the host bus;

temporary queue circuit storing the user command, the temporary queue circuit receiving an address and a data value for the operation over the host bus synchronized by the write enable signal, and storing the address and the data value.

25. The computer system of claim 24, wherein the command state machine comprises:

circuit for generating a temporary queue full signal indicating that the temporary queue holds the user command and the address and the data value for the operation;

operation queue circuit for buffering the operation;

circuit for generating a run micro controller signal, the run micro controller signal enabling the oscillator circuit to generate the clock signal, such that the clock signal causes transfer of the user command and the address and the data value to the operation queue circuit and resets the temporary queue full signal.

26. The computer system of claim 25, wherein the micro controller reads the user command and the address and the data value for the operation from the operation queue circuit and performs the operation on the flash cell array.

27. The computer system of claim 26, wherein the clock signal is a three phase clock sequence comprising a first phase clock, a second phase clock, and a third phase clock.

28. The computer system of claim 27, wherein the synchronizer circuit comprises:

circuit for receiving the halt signal and propagating the halt signal to a first register circuit in synchronization with the second phase clock;

second register circuit for receiving the halt signal from the first register circuit in synchronization with the first phase clock and propagating the halt signal to a third register circuit in synchronization with the third phase clock, the third register circuit for generating an oscillator disable signal in synchronization with the second phase clock.

29. The computer system of claim 28, wherein the interface circuit further comprises:

circuit for resetting the halt signal during the third phase clock if the write enable signal is active during the third phase clock, or if the subsequent user command specifying the subsequent operation is being received over the host bus during the third phase clock, or if the temporary queue full signal indicates that the temporary queue is not empty during the third phase clock;

circuit for resetting the halt signal during the first phase clock if the write enable signal is active during the first phase clock, or if the subsequent user command specifying the subsequent operation is being received over the host bus during the first phase clock, or if the temporary queue full signal indicates that the temporary queue is not empty during the first phase clock;

circuit for resetting the halt signal during the second phase clock if the run micro controller signal is not active.

* * * * *